US012408285B2

(12) United States Patent
Clark et al.

(10) Patent No.: US 12,408,285 B2
(45) Date of Patent: Sep. 2, 2025

(54) LATCH ASSEMBLIES FOR PROTECTING CHASSIS

(71) Applicant: Dell Products L.P., Round Rock, TX (US)

(72) Inventors: Peter Timothy Clark, Taipei (TW); Matthew Bryan Gilbert, Bend, OR (US); Richard William Guzman, Lago Vista, TX (US)

(73) Assignee: Dell Products L.P., Round Rock, TX (US)

( * ) Notice: Subject to any disclaimer, the term of this patent is extended or adjusted under 35 U.S.C. 154(b) by 217 days.

(21) Appl. No.: 18/496,190

(22) Filed: Oct. 27, 2023

(65) Prior Publication Data

US 2025/0142759 A1 May 1, 2025

(51) Int. Cl.
*H05K 7/14* (2006.01)
*E05C 5/02* (2006.01)
*H05K 7/20* (2006.01)

(52) U.S. Cl.
CPC ............ *H05K 7/1409* (2013.01); *E05C 5/02* (2013.01); *H05K 7/1489* (2013.01); *H05K 7/20772* (2013.01)

(58) Field of Classification Search
CPC ............ H05K 7/1409; H05K 7/1489; H05K 7/20772–20781; H05K 7/20809; H05K 7/20818; E05C 5/02
See application file for complete search history.

(56) References Cited

U.S. PATENT DOCUMENTS

| 5,309,325 | A | * | 5/1994 | Dreher | H05K 7/1409 403/321 |
|---|---|---|---|---|---|
| 6,181,549 | B1 | | 1/2001 | Mills | |
| 6,547,289 | B1 | | 4/2003 | Greenheck | |
| 6,579,029 | B1 | | 6/2003 | Sevde | |
| 7,002,799 | B2 | | 2/2006 | Malone et al. | |
| 7,749,006 | B2 | * | 7/2010 | Chiang | H05K 7/1409 439/160 |
| 8,941,993 | B2 | | 1/2015 | Eckberg et al. | |
| 9,609,778 | B1 | | 3/2017 | Spencer | |
| 9,723,756 | B1 | | 8/2017 | Masters | |
| 9,795,052 | B2 | | 10/2017 | Hsiao | |
| 10,070,549 | B2 | | 9/2018 | Su | |
| 10,206,302 | B2 | * | 2/2019 | Liao | G06F 1/183 |

(Continued)

FOREIGN PATENT DOCUMENTS

CN 108811420 A * 11/2018 ........... H05K 7/1409

*Primary Examiner* — Robert J Hoffberg
(74) *Attorney, Agent, or Firm* — WOMBLE BOND DICKINSON (US) LLP

(57) ABSTRACT

Devices, systems, and methods for managing chassis of data processing systems are disclosed. The chassis may be managed by reversibly attaching them to structural members such as rails. When so attached, the chassis may be fixedly held in a position. To facilitate access to an interior of the chassis, the chassis may be detached from the structural member and moved to a maintenance position. To detach the chassis from the structural member, the chassis may include a latch assembly. The latch assembly may include features to inform and remind technicians or other persons of the existence, or lack thereof, of various lines connecting the chassis, and components positioned in the chassis, to other components.

20 Claims, 13 Drawing Sheets

(56) References Cited

U.S. PATENT DOCUMENTS

| | | |
|---|---|---|
| 10,499,527 B2 | 12/2019 | Liao |
| 10,563,429 B1 | 2/2020 | Bailey |
| 10,584,514 B2 | 3/2020 | Leong |
| 10,681,835 B2 | 6/2020 | Moore |
| 11,330,728 B2 | 5/2022 | Ye |
| 11,419,224 B1 | 8/2022 | Wang |
| 2002/0182896 A1 | 12/2002 | Welsh |
| 2006/0053599 A1 | 3/2006 | Chang |
| 2006/0215373 A1 | 9/2006 | Joist |
| 2007/0240463 A1 | 10/2007 | Antonucci |
| 2009/0181568 A1 | 7/2009 | Chiang |
| 2013/0018505 A1 | 1/2013 | Barrett |
| 2013/0098123 A1 | 4/2013 | Gorontzi |
| 2013/0241377 A1 | 9/2013 | Zhang |
| 2014/0352223 A1 | 12/2014 | Le |
| 2015/0327389 A1 | 11/2015 | Westphall |
| 2016/0150659 A1 | 5/2016 | Chen |
| 2017/0048992 A1 | 2/2017 | Katsaros |
| 2017/0150634 A1 | 5/2017 | Huang |
| 2025/0142747 A1 * | 5/2025 | Clark .................. H05K 7/1489 |

* cited by examiner

LATCH ASSEMBLIES FOR PROTECTING CHASSIS

FIELD OF THE DISCLOSURE

Embodiments disclosed herein generally relate to a device management. More particularly, embodiments disclosed herein relate to systems and methods to manage chassis.

BACKGROUND

Computing devices may provide various types of computer implemented services. To provide the computer-implemented services, computing devices may include various type of hardware devices such as, for example, processors, memory modules, and storage devices. These hardware components may need to be positioned with one another to provide their respective functions. Similarly, various components devices may be aggregated together to form a computing system.

BRIEF DESCRIPTION OF THE DRAWINGS

Embodiments disclosed herein are illustrated by way of example and not limitation in the figures of the accompanying drawings in which like references indicate similar elements.

FIGS. 2A-2J show diagrams illustrating a chassis and components thereof in accordance with an embodiment.

DETAILED DESCRIPTION

Figure 1:
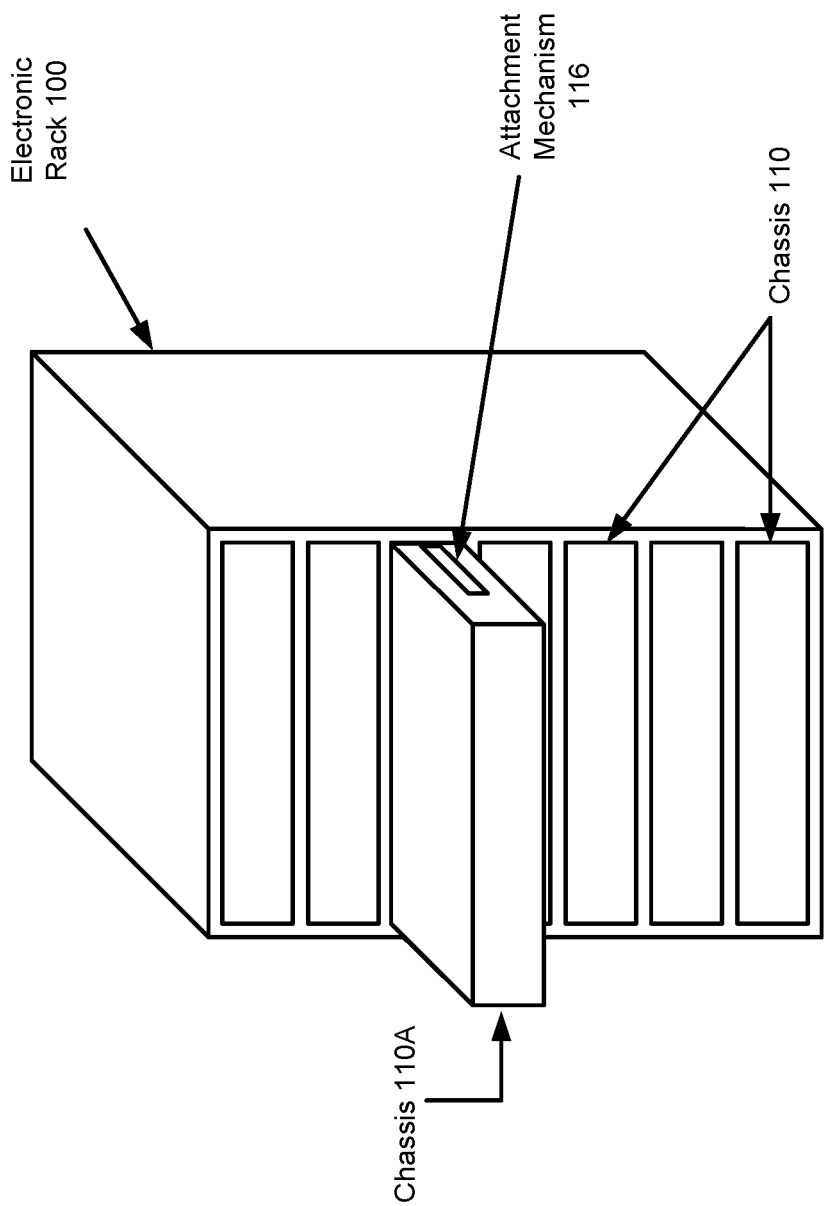
FIG. 1 shows a diagram illustrating an electronic rack in accordance with an embodiment.

Various embodiments will be described with reference to details discussed below, and the accompanying drawings will illustrate the various embodiments. The following description and drawings are illustrative of the embodiment disclosed herein and are not to be construed as limiting the disclosed embodiments. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrases "in one embodiment", "an embodiment", and similar recitations in various places in the specification do not necessarily all refer to the same embodiment.

In general, embodiments disclosed herein relate to devices, systems, and methods for managing chassis of data processing system. The chassis may be managed by reversibly attaching them to structural members such as rails. When so attached, the chassis may be fixedly held in a position.

To facilitate access to an interior of the chassis, the chassis may be detached from the structural member and moved to a maintenance position (e.g., rolled out of an electronic rack to remove a top cover to access hardware components in the chassis). To detach the chassis from the structural member, the chassis may include a latch assembly.

The latch assembly may be positioned in an ear of the chassis and facilitate detachment of the chassis from the rail. To limit the likelihood of lines to the chassis being damaged during movement of the chassis to the maintenance position, the latch assembly may include indicators that provide indications regarding whether the lines are attached to the chassis.

Additionally, the latch assembly may require a multi-step process for detachment. The multi-step process may include sliding a latch of the latch assembly from an at rest position to a second position. Once in the second position, the latch may be rotated which may detach the chassis from the rail. The latch assembly may prevent rotation of the latch while the latch is in the at rest position.

By doing so, likelihood of damage to lines may be reduced thereby improving the likelihood of the systems providing and continuing to provide desired computer implemented services.

In an embodiment, a data processing system is provided. The data processing system may include a chassis to house hardware components; an ear of the chassis, the ear of the chassis comprising: a reserved area, and a latch area; a latch assembly positioned with the latch area and fixedly attached to the chassis, comprising: a latch comprising: a first portion mechanically coupled to translate between a first position and a second position with respect to a second portion of the latch; the second portion of the latch; a pivot mechanically coupled to the second position, the pivot being adapted facilitate rotation of the first portion between the second position and a third position; and an interference portion adapted to: prevent the latch from rotating while the first portion is in the first position; and allow the latch to rotate while the first portion is in the second position.

The data processing system may also include an attachment member adapted to: secure the latch assembly to a structural member of an electronic rack for housing the chassis while the first portion is in the first position; and release the latch assembly from the structural member while the first portion is in the third position.

While the attachment member is secured to the latch assembly, the chassis may be secured in a first position in the electronic rack.

While the attachment member is released from the latch assembly, the chassis may be free to move from the first position in the electronic rack to a second position with respect to the electronic rack.

The data processing system may also include a cooling system positioned in the chassis.

The data processing system may further include an indicator adapted to indicate whether the cooling system is physically connected to an external component outside of the chassis via one or more structural elements, or the cooling system is physically detached from the external component.

The indicator may generate a first color of light while the cooling system is physically connected to the external component outside of the chassis, and generates a second color of light while the cooling system is detached from the external component.

The indicator may be positioned to be visible while the first portion is in the first position and obscured from view while the first portion is in the second position.

The first portion may include a first end positioned to generate an interference with a wall of the ear while the first portion is in the first position, and release the interference with the wall while the first portion is in the second position.

The first portion may include a force receiving area to receive a first force that moves the first portion from the first position to the second position.

Application of a second force to the force receiving area while the first portion is in the second position may initiate rotation of the first portion to the third position.

The rotation of the first portion may expose another force receiving area of the latch, and application of a third force to the other force receiving area of the latch may complete the rotation of the first portion to the third position.

In an embodiment, a chassis is provided, as discussed above.

In an embodiment, a latch assembly is provided, as discussed above.

Turning to FIG. 1, a diagram illustrating electronic rack 100 in accordance with an embodiment is shown. Electronic rack 100 may be used to store computing devices in one or more chassis 110. Chassis 110 may be physical devices for housing components such as computing devices.

In FIG. 1 and throughout, an example chassis is shown that conforms to a particular form factor (e.g., rack mount). However, it will be appreciated that embodiments disclosed herein may be used with respect to chassis that conform to other form factors without departing from the embodiments.

The computing device housed in chassis 110A may include one or more components. The component may include, for example, hardware devices that may varying in shape, performance, functionality, and/or other characteristics. The hardware devices may include one or more of the following types of hardware components: (i) memory modules such as random access memory (RAM), (ii) processing devices such as a central processing unit (CPU), (iii) storage devices such as hard disk drives, solid state drives, etc., (iv) input and output (I/O) devices, and/or (v) other types of hardware devices that may aid in providing computer implemented services.

One or more of chassis 110, such as chassis 110A, within electronic rack 100 may include an attachment mechanism (e.g., 116). Attachment mechanism 116 may include sliders or other physical structures for attaching a chassis to electronic rack 100. The attachment mechanism may also allow for the chassis to move within a limited range with respect to electronic rack 100. For example, the chassis may move into and/or out of electronic rack 100.

Figure 2A:
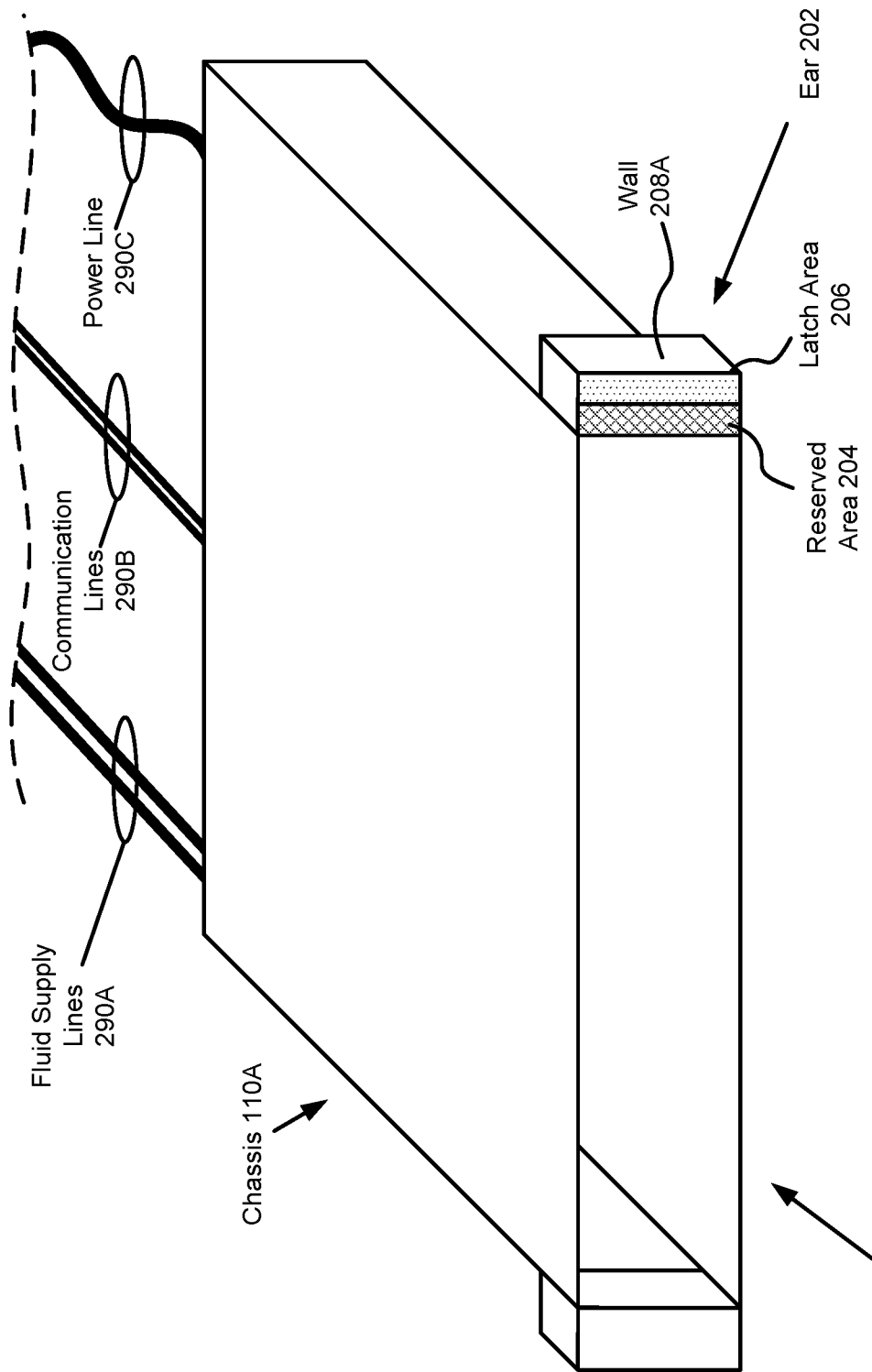

The movement of chassis 110 may be constrained by rails and/or other types of mechanisms for fixing the position of chassis 110 in place at least temporarily. For example, while operating chassis 110A may be moved to a first position and fixed in place. However, to perform maintenance on and/or for other reasons, chassis 110A may be released and moved (e.g., rolled out). Refer to FIG. 2A for additional information regarding fixing chassis 100A in place.

In FIG. 1, chassis 110A is illustrated in a first position (e.g., after sliding out of electronic rack 100), while other chassis are illustrated in a second position (e.g., after sliding into electronic rack 100). The second position may be the position in which the data processing system housed in the chassis are operated.

Electronic rack 100 may include openings and/or corresponding attachment points for attachment mechanisms of chassis 110 to stack any number of chassis 110 with respect to one another. The openings and/or attachment points may be positioned based on the dimensions of chassis 110

While illustrated in FIG. 1 with respect to a limited number of specific components in specific positions and orientations, an electronic rack may include different number and/or types of components with different positions and/or orientations without departing from embodiments disclosed herein.

Turning to FIG. 2A, a first diagram of chassis 110A in accordance with an embodiment is shown. Chassis 110A may include one or more openings (e.g., 200). These openings may allow gasses to flow through the interior of chassis 110A. The flow of gasses may be regulated, and used to thermally manage the hardware components within chassis 110A.

For example, during operation of a data processing system, hardware components of the data processing system may consume power and generate heat. To manage the heat, gasses may flow into or out of opening 200. The flow of gasses may carry the generated heat outside of chassis 110A.

However, flows of gas may be insufficient to cool the hardware components within chassis 110A. To supplement the gasses, various chilled fluids and water blocks may be used to dissipate generated heat. To obtain the chilled fluids and remove them from chassis 110, various fluid supply lines 290A may be used. Fluid supply lines 290A may be reversibly connected to various components within chassis 110A and a chilling system (not shown) to establish a chilled fluid loop. The chilled fluid in combination with air flow may have sufficient capacity to dissipate heat generated by components within the chassis.

The hardware components within the chassis may also be reversibly connected to communication lines 290B and/or power line 290C. These lines may carry communications between the hardware components within chassis 110A, and provide power to the hardware components.

Once the lines are attached to the hardware components, chassis 110A may be moved into an operating position (e.g., rolled into the electronic rack), and fixed to various structural members.

To facilitate fixed attachment of chassis 110A to structural members of electronic rack such as rails, chassis 110A may include ears (e.g., 202). An ear of chassis 110A may be a lateral extension towards a front of the chassis. The ear may not be in line with the interior of chassis 110A thereby not obstructing access to hardware components within chassis 110A. Ear 202 may be surrounded by one or more walls (e.g., 208A)

To facilitate reversible attachment of chassis 110A to the structural members, a latch (not shown) may be positioned with ear 202. The latch may be actuated by a person to disconnect the chassis from the structural members.

To improve the amount of front side real estate of chassis 110A available for use for purposes other than for detachment of the chassis from the attachment mechanism, the front side area of the chassis may be allocated for different purposes. For example, some reserved area 204 may be reserved for purposes other than for housing the latch and a latch area (e.g., 206) in which the latch may be positioned.

Once positioned in the electronic rack, the hardware components may operate to provide desired computer implemented services. From time to time and for various reasons, maintenance on the hardware components may need to be performed. To do so, chassis 110A may need to be detached from the structural members and rolled outward from the electronic rack.

However, detachment of chassis 110A presents risk of the lines (e.g., 290A-290C) being damaged during movement of chassis 110A. To limit the risk, the lines may be proactively detached ahead of rolling chassis 110A outward from the electronic rack. However, by being on a rear side of chassis 110A, a technician or other person may overlook the presence of the lines. For example, when viewed from a front side of the electronic rack, the lines may not be visible. Thus, even if procedurally required, the lack of visibility of the lines may still result in chassis 110A being rolled outward while the lines are still attached due to oversight of the technician.

In general, embodiments disclosed herein relate to methods, systems, and devices for facilitating movement of chassis with reduced risk of damage to lines attached to the chassis. To facilitate the movement, a data processing system may include a latch assembly. The latch assembly may include indicators that may indicate that attachment status of various lines. The indicators may warn technicians and/or other persons of risk of damage to the lines due to movement of chassis 110A.

For example, sensors (e.g., optical, acoustic, capacitive, fluid, etc.) may be coupled to the lines and/or hardware components of chassis 110A to detect the attachment status of the respective lines. The activity of the indicators may be set based on the attachment status of the lines.

By doing so, embodiments disclosed herein may provide a data processing system that may be less likely to be damaged due to connected lines. Thus, embodiments disclosed herein may provide a data processing system with improved usability by increased the likelihood of continued operation of the data processing system.

Figure 2B:
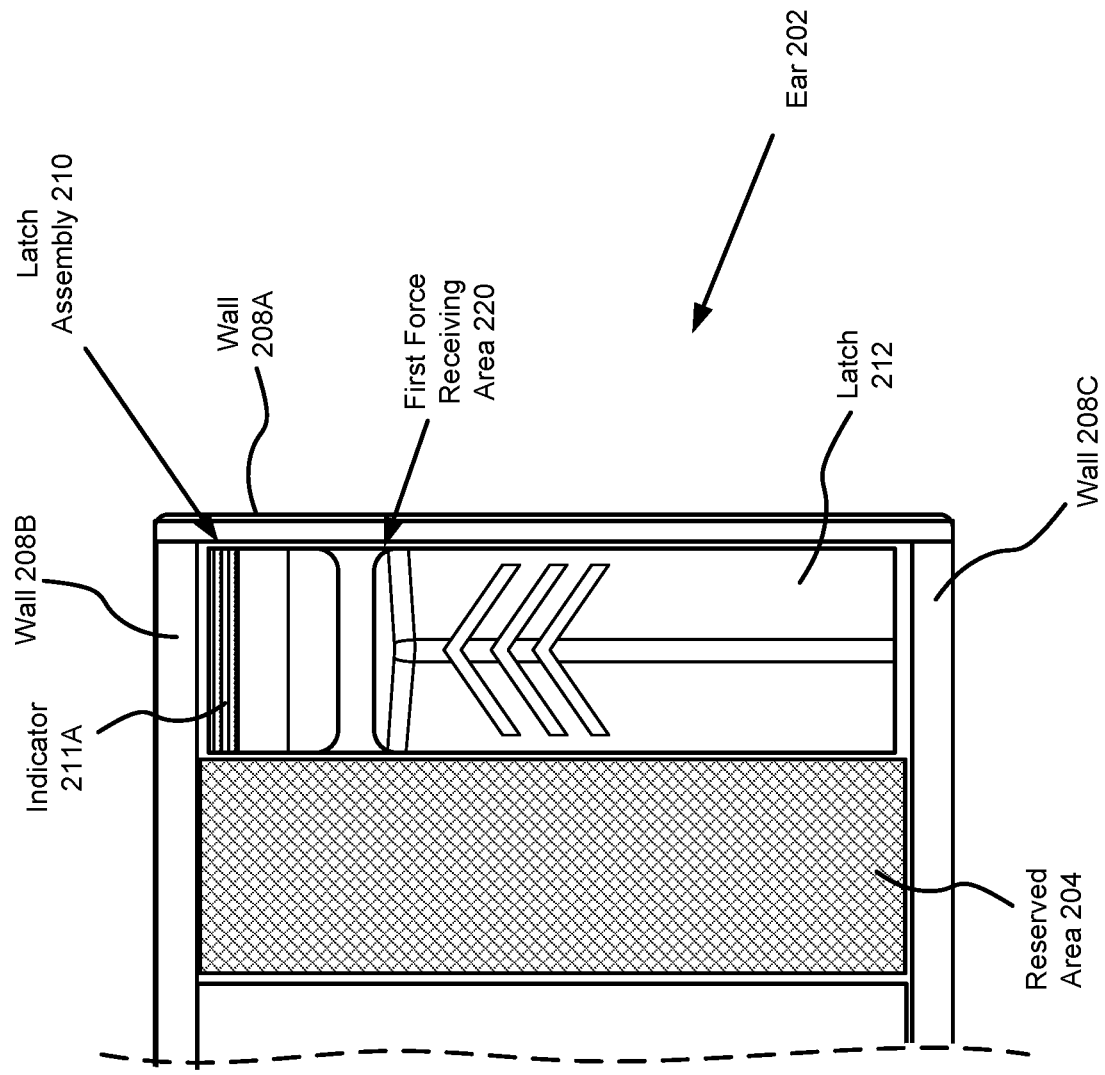
Figure 2C:
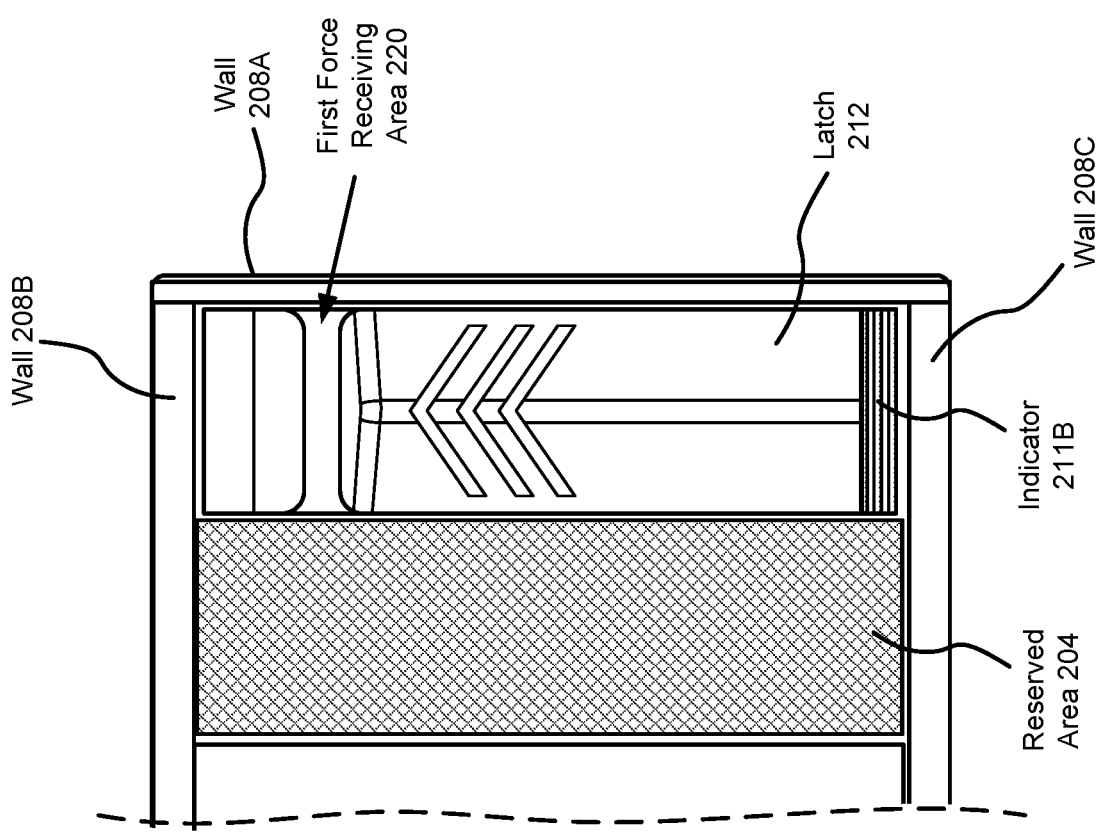
Figure 2D:
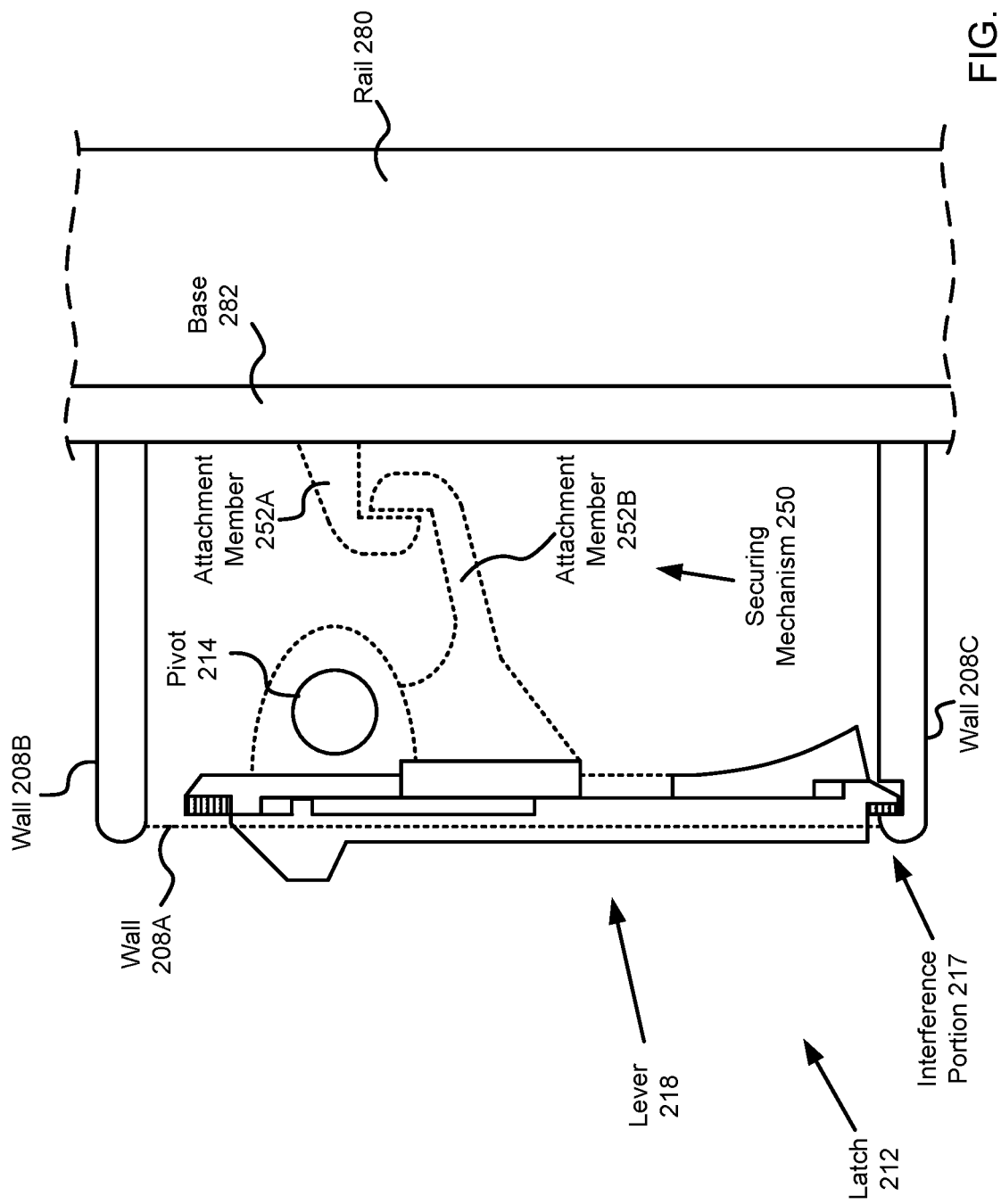
Figure 2E:
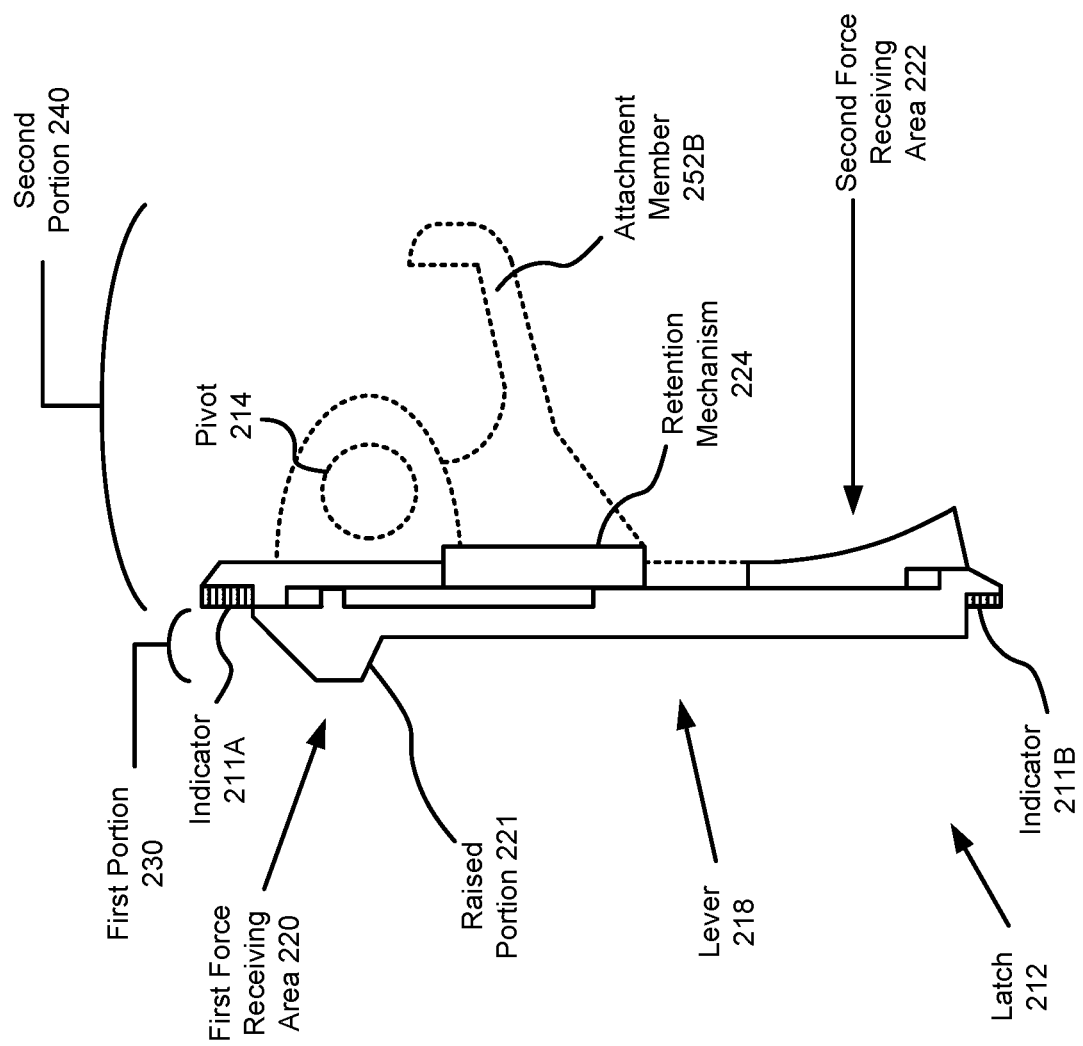
Figure 2F:
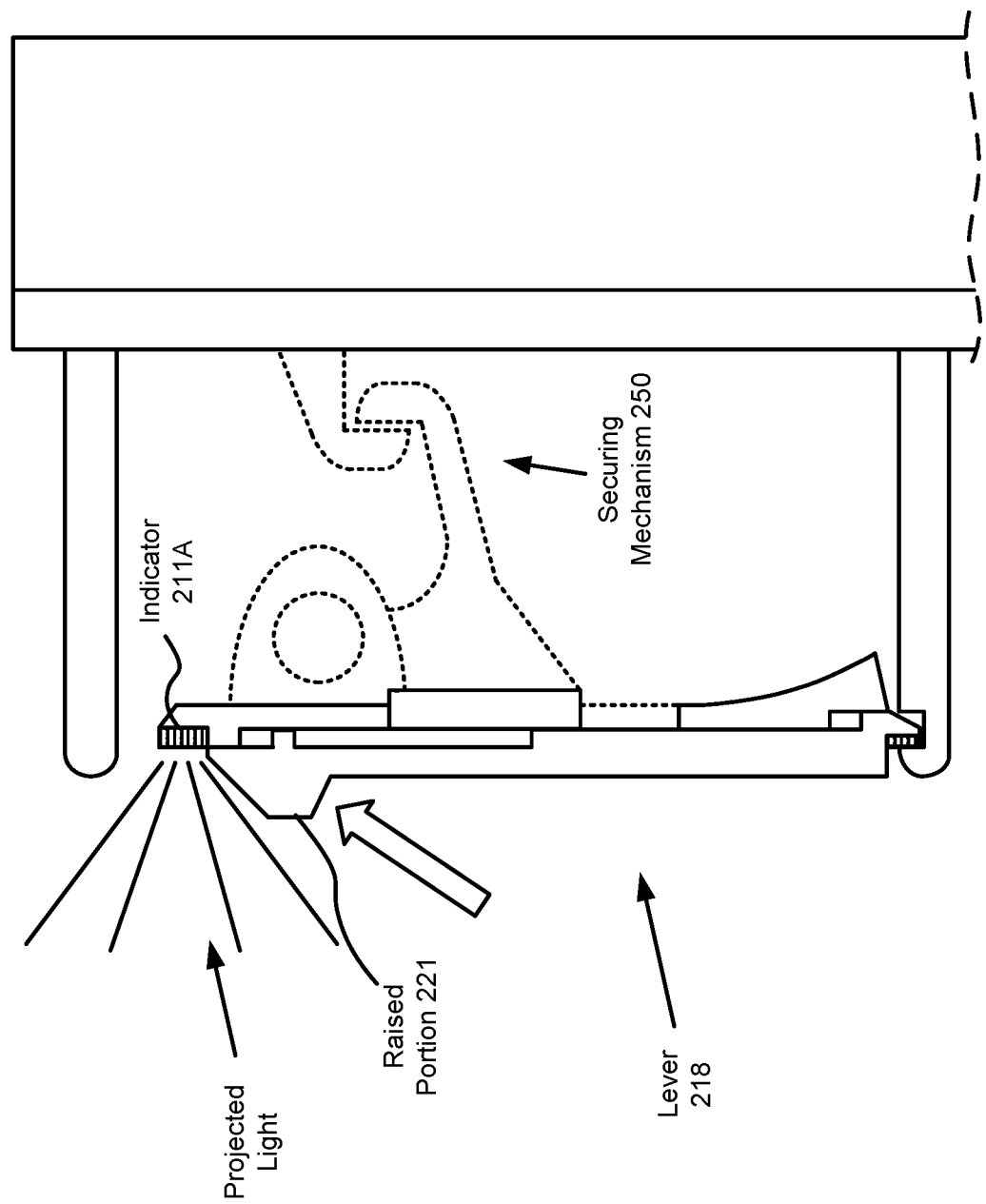
Figure 2G:
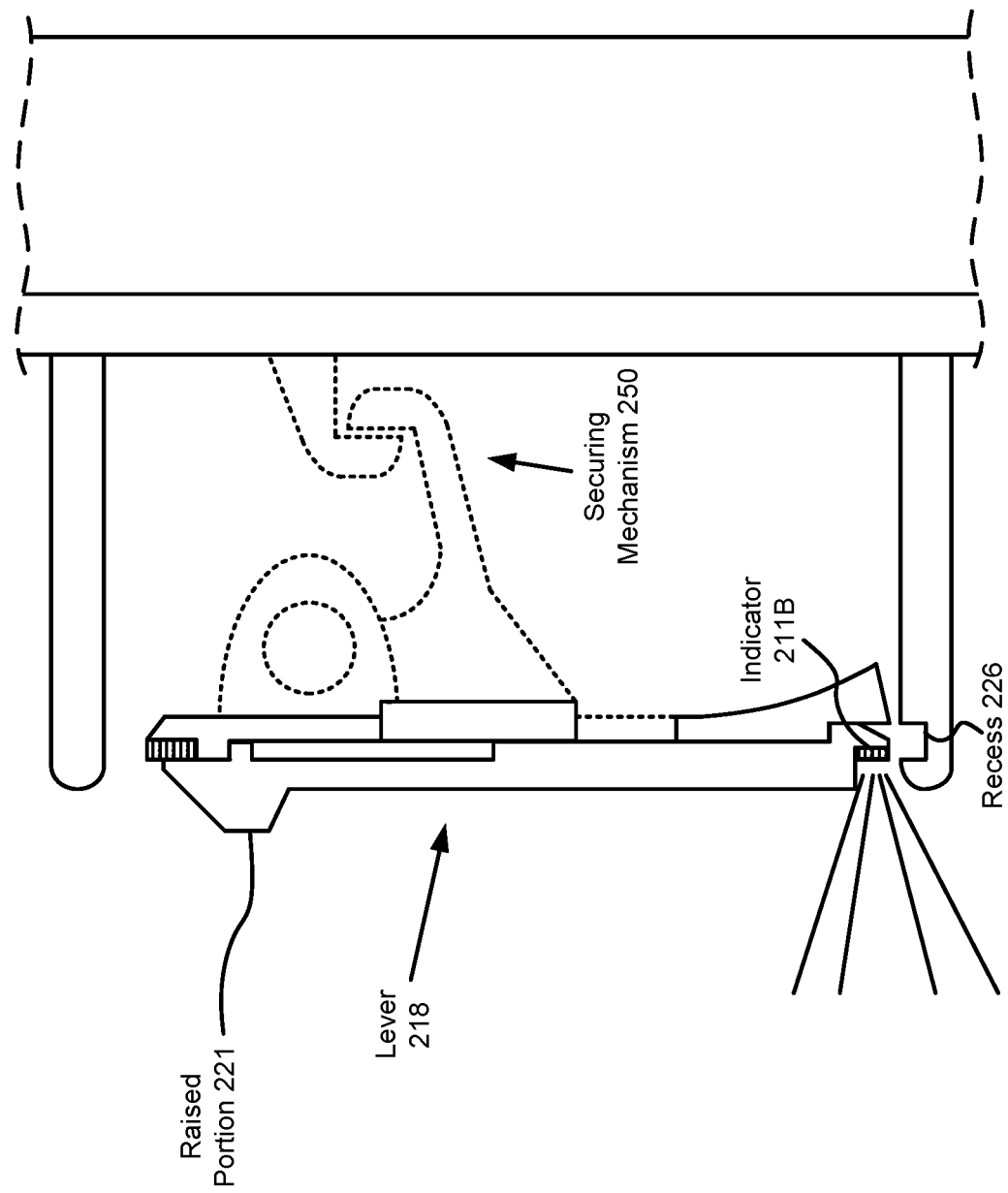
Figure 2H:
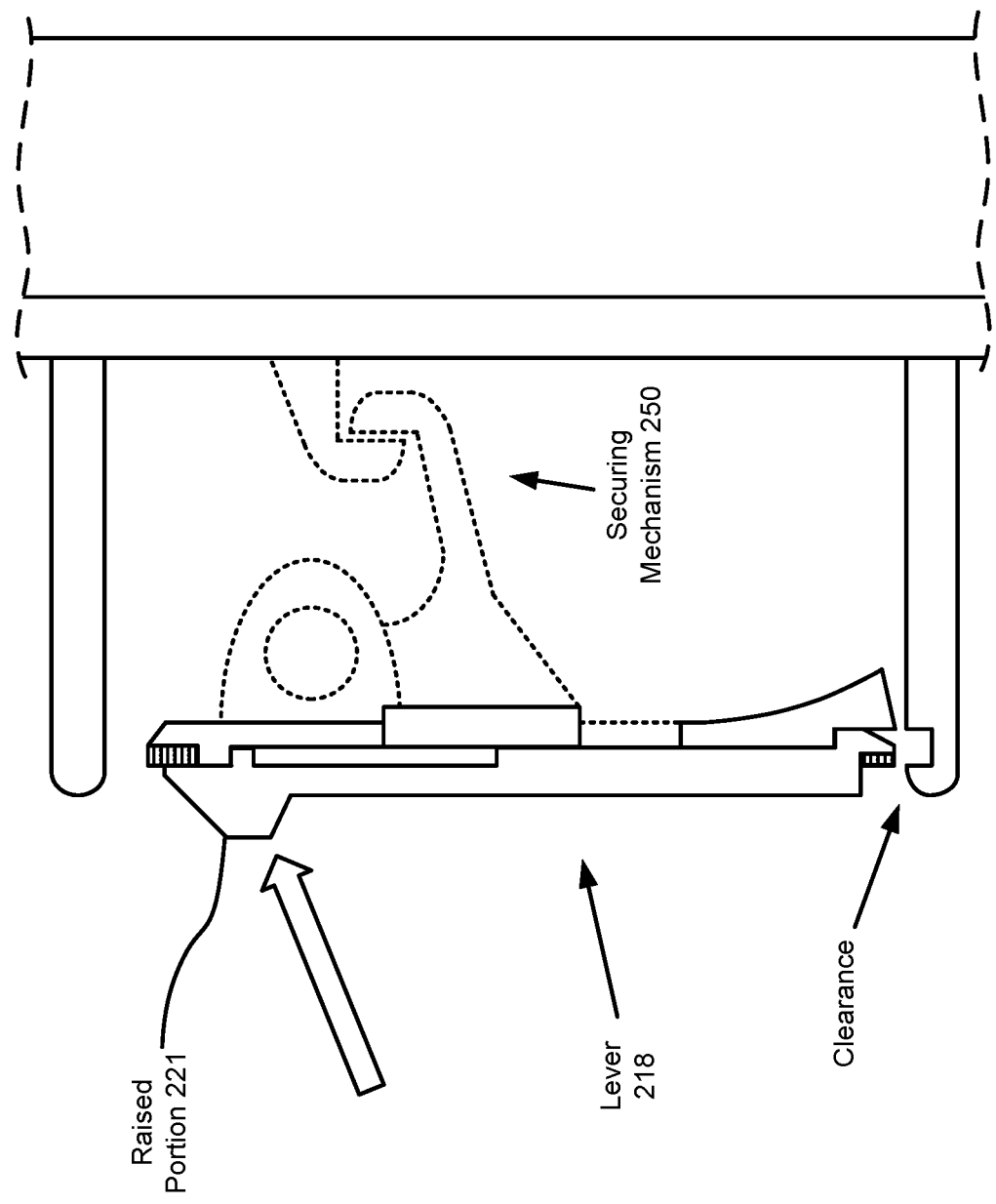
Figure 21:
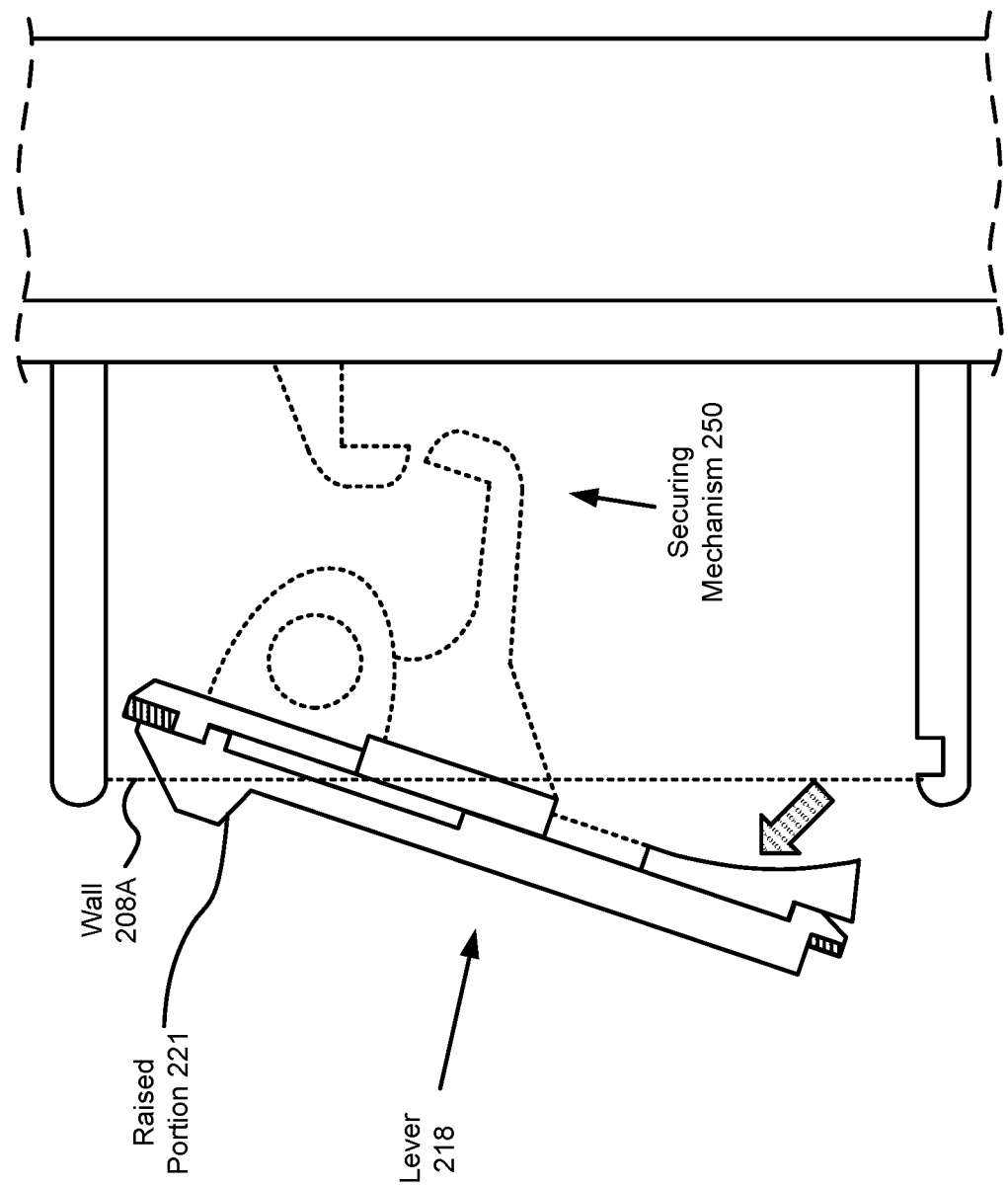
Figure 2J:
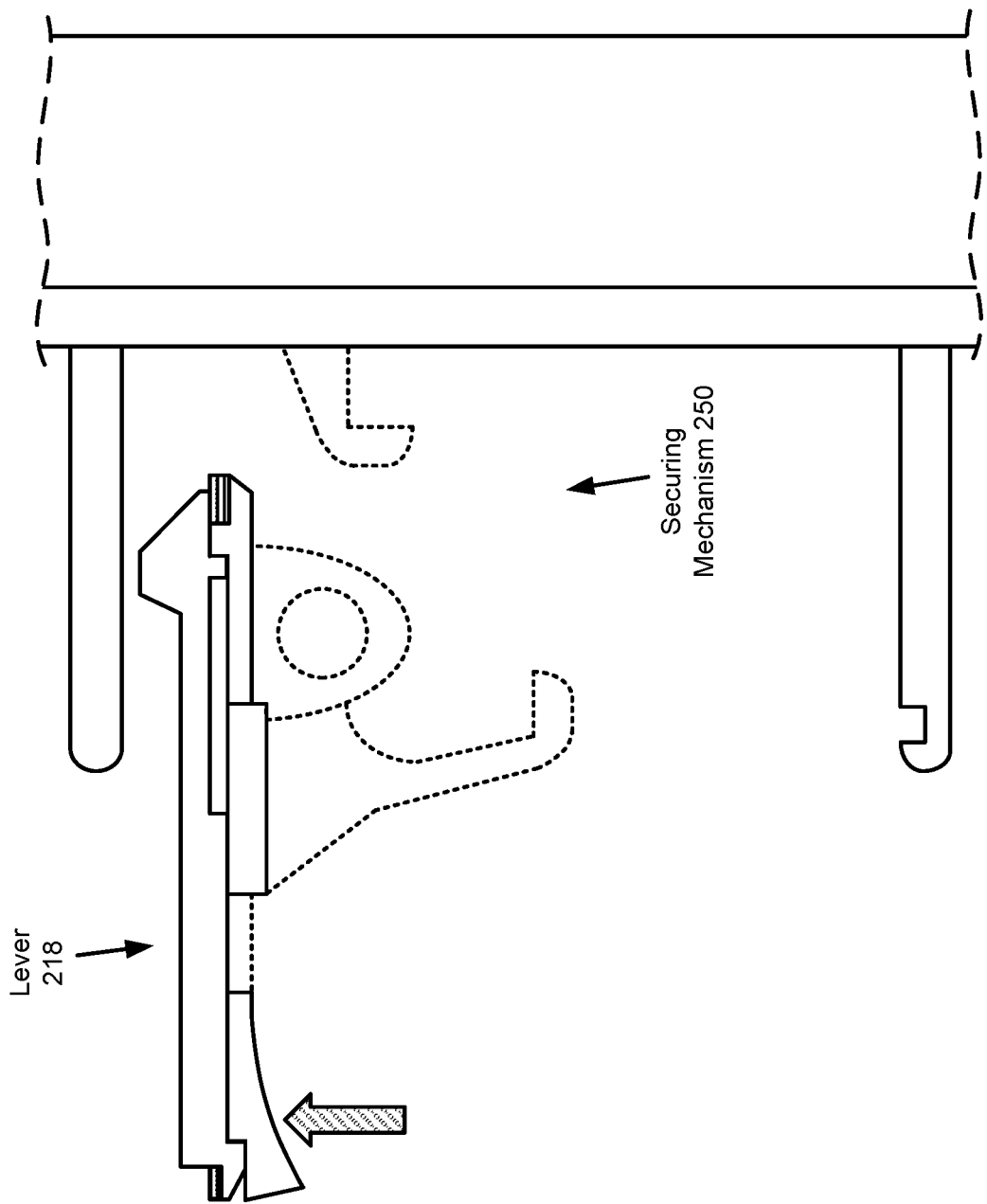
Figure 3:
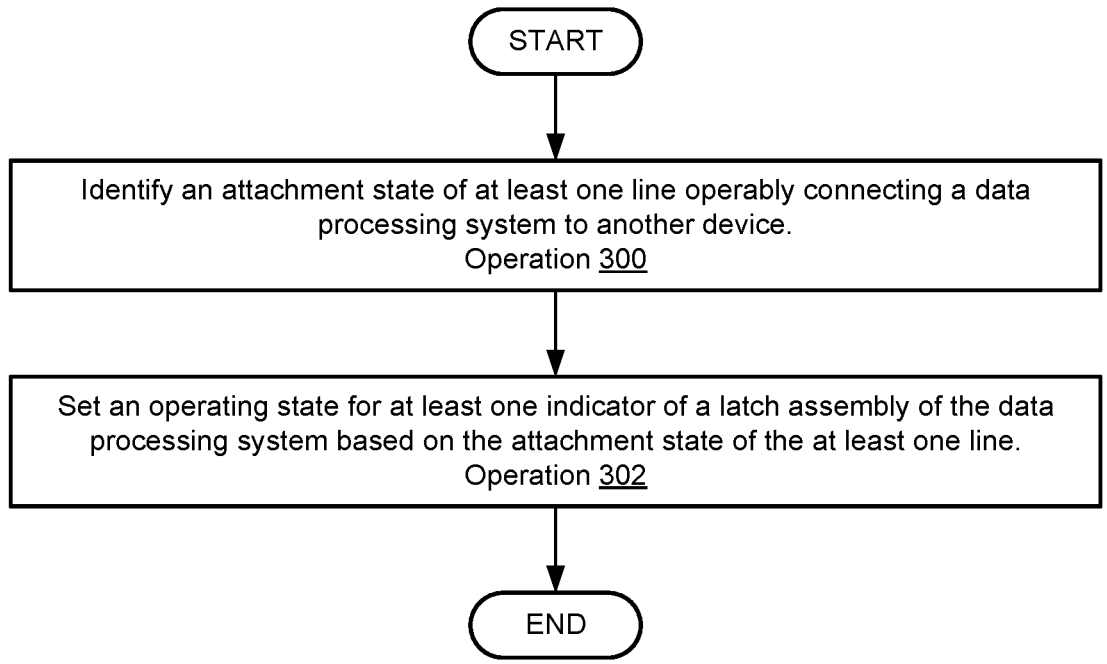
FIG. 3 shows a flow diagram illustrating a method of managing a chassis in accordance with an embodiment.

When providing its functionality, a data processing system in accordance with an embodiment may perform all, or a portion, of the actions and methods illustrated in FIGS. 2B-3.

A data processing system may be implemented using a computing device such as a host or a server, a personal computer (e.g., desktops, laptops, and tablets), a "thin" client, a personal digital assistant (PDA), a Web enabled appliance, a mobile phone (e.g., Smartphone), an embedded system, local controllers, an edge node, and/or any other type of data processing device or system. For additional details regarding computing devices, refer to FIG. 4.

While illustrated in FIGS. 1-2A as including a limited number of specific components, a data processing system in accordance with an embodiment may include fewer, additional, and/or different components than those illustrated therein.

Turning to FIG. 2B, a first front view diagram of ear 202 in accordance with an embodiment is shown. Ear 202, as discussed above, may include an extension of a chassis to facilitate reversible attachment of the chassis to an attachment mechanism.

To enable such reversible attachment, latch assembly 210 may be positioned in the latch area of ear 202 and may be surrounded by walls 208A-208C. Latch assembly 210 may include latch 212, and indicator 211A (as well as indicator 211B, shown in FIG. 2C). Each of these components of latch assembly 210 is discussed below.

Latch 212 may facilitate detachment of a chassis from a rail or other type of attachment mechanism of an electronic rack. Latch 212 may include a lever with one or more surfaces for application of force. Latch 212 may be at least partially enclosed by walls 208A-208C.

To facilitate actuation of latch 212, latch 212 may include first force receiving area 220. First force receiving area may include a raised area such that a person may apply lateral force (e.g., up/down on the page) to latch 212 as well as orthogonal force (e.g., into the page) to latch.

To actuate latch, a person may first apply lateral force to first force receiving area 220 to move latch 212 from an at rest position (e.g., a first position) to a second position. While in the first position, latch 212 may resist orthogonally applied force but may rotate with respect to orthogonally applied force while in the second position. Detachment of the chassis may require that latch 212 rotate. In FIG. 2B, latch 212 is illustrated in the first position and in FIG. 2C latch 212 is illustrated as being in the second position.

To reduce the likelihood that detachment of the chassis damage lines connected to it, latch assembly 210 may include the indicators (e.g., 211A-211B). Indicators may provide stimulus (e.g., visual, audio) indicating the attachment state of the lines.

For example, indicator 211A may include a light emitting diode or other optical device that may display different colors and/or patterns of light corresponding to different detachment states. Thus, the person attempting to detach the chassis may be informed of the attachment state of the lines.

However, a first stimulus may be insufficient to convey the level of risk in activity that person may be performing. To provide additional stimulus, latch assembly 210 may include one or multiple indicators.

Turning to FIG. 2C, a second front view diagram of ear 202 in accordance with an embodiment is shown. In FIG. 2C, latch 212 is shown in the second position. A seen in FIG. 2C, indicator 211B may be exposed to view while latch 212 is in the second position but before the chassis has been detached through rotation of latch 212.

Indicator 211B, like indicator 211A may provide a stimulus based on the attachment state of the lines. Thus, when a person slides latch 212 to the second position, this source of stimulus may be provided to the user. Accordingly, the act of sliding the latch may cause different stimuluses to be provided to the person depending on the attachment states of the lines.

To further clarify embodiments disclosed herein, cross section diagrams illustrating various aspects of the latch assembly are shown in FIGS. 2D-2J. In these figures, outlines of shapes drawn in short dashing indicate that the shapes may be positioned above and/or below the cut plane used in the cross section diagrams while outlines of shapes drawn in solid line indicate that the cut plane is through the shapes. Additionally, line dashed lines indicate that the shape intersected by the dashed lines may continue beyond the long dashed lines.

Turning to FIG. 2D, a first cross section view diagram of a latch assembly in accordance with an embodiment is shown. The latch assembly may include latch 212, pivot 214, and securing mechanism 250.

To facilitate attachment and detachment of the chassis, latch 212 may be rotatably connected to pivot 214. Pivot 214 may be attached to wall 208A of an ear. Thus, latch 212 may be anchored to the chassis via attachment to the ear via pivot 214.

Latch 212 may be reversibly fixedly secured to a rail (e.g., 280, of an electronic rack) via securing mechanism 250. When so secured the chassis may be secured to rail 280, thereby limiting the movement of the chassis.

To reversibly fixedly secure latch 212 to rail 280, securing mechanism 250 may include attachment members 252A-252B. These securing members may include hooks or other structures that create an interference with one another while latch 212 is in a first position, and release the interference after latch 212 is rotated outward. Attachment member 252A may be attached to base 282 (e.g., a plate or other adapter) which may be connected to rail 280. Refer to FIGS. 2I-2J for additional details regarding releasing the interference mechanism and rolling the chassis out from the electronic rack.

To facilitate translation and rotation of latch 212, latch 212 may include lever 218. As seen in FIG. 2D, lever 218 may extend away from pivot 214 thereby providing a person with mechanical leverage with respect to rotating latch 212 through application of force to it.

However, while in the first position, an interference portion 217 of lever 218 may create an interference with wall 208C. For example, the end of lever 218 may extend at least partially into a recess in wall 208C. Thus, while in the first position, the interference portion may prevent lever 218 from rotating with respect to pivot 214.

To enable lever 218 to rotate, at least a portion of lever 218 may slide away from wall 208C. Refer to FIG. 2E for additional details regarding sliding a portion of lever 218.

Turning to FIG. 2E, a second cross section view diagram of a latch assembly in accordance with an embodiment is shown. In FIG. 2E, some components of FIG. 2D are omitted to highlight aspects of embodiments disclosed herein.

Latch 212 may include a first portion 230 and a second portion 240. First portion 230 of latch 212 may be mechanically coupled to second portion 240 in a slidable manner. The coupling may allow first portion 230 to slide to release the interference between the end of lever 218 and a wall so that latch 212 may be free to rotate.

For example, a person may apply lateral force to raised portion 221 of first portion 230 to move slide first portion 230 with respect to second portion 240. The person may apply sufficient force to overcome a retention mechanism (e.g., 224).

Retention mechanism 224 may be a mechanism (e.g., spring loaded) that returns first portion 230 to an at rest position where the end of lever 218 creates the interference with the wall of the ear.

Second portion 240 may generally include, for example, structural members to attach first portion 230 to pivot 214, and attachment member 252B. As will be discussed in greater detail below, a second force receiving area may be positioned with second portion 240. For example, second force receiving area 222 may be positioned on a back side of lever 218.

Turning to FIG. 2F, a third cross section view diagram of a latch assembly in accordance with an embodiment is shown. While first portion of lever 218 is in the first position (e.g., at rest), indicator 211A may be exposed thereby allowing indicator 211A to project light. The light may inform a person of the attachment state of lines to the chassis. While not shown, indicator 211A may be operably coupled to various hardware components such as a microcontroller which may selectively power indicator 211A to generate various colors corresponding to the attachment state of the lines. To do so, the microcontroller may be coupled to the sensors, and may read the sensors to identify the attachment state.

Presuming that the projected light indicates that the attachment state of the lines is detached (and/or otherwise in a condition that reduces the likelihood of damage to the lines), a person may apply lateral force to raised portion 221. In FIG. 2F, the lateral force is illustrated using an oversized arrow.

The force may cause the first portion to slide with respect to the second portion to release the interference between the lever and the wall of the ear.

Turning to FIG. 2G, a fourth cross section view diagram of a latch assembly in accordance with an embodiment is shown. Continuing with the discussion from FIG. 2F, after sufficient force has been applied to overcome the retention mechanism, the first portion of the latch may move upward from the first position to the second position, as shown in FIG. 2G.

As seen in FIG. 2G, doing so may expose indicator 211B by withdrawing it from recess 226, thereby allowing indicator 211B to project another light field while securing mechanism 250 continues to secure the chassis to the rail. Thus, while the chassis is still secured, the person may be provided with another indication of the attachment state of the lines.

Turning to FIG. 2H, a fifth cross section view diagram of a latch assembly in accordance with an embodiment is shown. Continuing with the discussion from FIG. 2G, to release securing mechanism 250, orthogonal force may be applied to raised portion 221. The orthogonal force may cause lever 218 to rotate (clockwise in FIG. 2H) thereby causing securing mechanism 250 to release the chassis.

For example, when the orthogonal force is applied, a clearance between the bottom of lever 218 and the wall may be established so that lever 218 may rotate freely.

Turning to FIG. 2I, a sixth cross section view diagram of a latch assembly in accordance with an embodiment is shown. Continuing with the discussion from FIG. 2H, the orthogonal force may be limited in application by wall 208A. Thus, when applied, the orthogonal force may only cause lever 218 to partially rotate. Depending on the implementation of securing mechanism 250, this partial rotation may or may not be sufficient to release the chassis from the rail.

If insufficient, the partial rotation may expose a rear of lever 218. Consequently, the person may hook a finger around or under lever 218 to apply a rear side force (e.g., indicated by the oversized arrow with lined infill). This force may be continuously applied to complete the rotation of lever 218 moving it to a final (e.g., third) position.

Turning to FIG. 2J, a seventh cross section view diagram of a latch assembly in accordance with an embodiment is shown. Continuing with the discussion from FIG. 2I, the rear side force may sufficiently rotate lever 218 to fully detach the chassis from the rail, as shown in FIG. 2J. In this manner, the chassis may be selectively detached from the electronic rack using the latch in a manner that reduces the likelihood of damage to the lines.

Damage to the lines may result in undesired outcomes. For example, if a liquid line is damaged, liquid may come into contact with hardware components. This contact may damage or degrade the hardware components.

In another example, if a communication line is damaged, the communication line may need to be replaced which may be challenging if the communication line is a fiber optic cable or other type of high bandwidth line.

In a further example, if the line is a power line, then the line may need to be replaced and/or if not discharged the damage to the line may result in an undesired release of electricity which may damage hardware components and/or cause other undesired impacts.

While described and shown in FIGS. 2C-2J with respect to securing mechanism 250, it will be appreciated that other types of mechanisms and/or mechanisms performing similar functions but having different components may be used without departing from embodiments disclosed herein.

As discussed above, the components of FIG. 1 may perform and be used in performance of various methods.

FIG. 3 illustrates a method that may be performed with the components shown in FIGS. 1-2J. In the diagram discussed below and shown in FIG. 3, any of the operations may be repeated, performed in different orders, and/or performed in parallel with or in a partially overlapping in time manner with other operations.

Turning to FIG. 3, a flow diagram illustrating a method of managing disconnection of a chassis from an electronic enclosure in accordance with an embodiment is shown. The method may be performed, for example, with any of the device shown in FIG. 1 (e.g., data processing systems housed in chassis), various components of the devices, and/or other devices not shown in FIGS. 1-2J.

Prior to operation 300, a data processing system may be installed in an electronic rack. During the installation, various lines may be attached and the chassis in which hardware components are positioned may be slid into a chassis until ears of the chassis reach rails. At which point, a securing mechanism may secure the chassis to the rails. When so secured, a latch may be positioned in an at rest position.

Once in the electronic rack, the data processing system may begin to provide compute implemented services. To do so, various fluids, communications, electricity, etc. may flow through the lines.

At operation 300, an attachment state of at least one line operably connecting the data processing system to another device is identified. The attachment state may be identified by (i) reading or otherwise obtaining data regarding the connection between the line and a hardware component within the chassis, and (ii) using the data to identify the attachment state.

For example, if the at least one line includes a fluid line, a fluid flow rate sensor, a pressure sensor, and/or other type of fluid sensor may be positioned with the line to facilitate identification of whether the line is attached hardware components within the chassis (e.g., attached to cooling blocks on the hardware components). The sensor may be other types of sensors such as bump sensors which may sense whether a line is positioned through a hole in the chassis, an optical sensor which may sense presence of the line, and/or other type of sensors.

At operation 302, an operating state for at least one indicator of a latch assembly of the data processing system is set based on the attachment state of the at least one line. The operating state may be set by (i) performing a lookup, applying a rule, and/or otherwise using the attachment state to identify the operating state, and (ii) powering and/or otherwise configuring operation of the at least one indicator based on the attachment state of the at least one line.

For example, the attachment state may be used to perform a lookup in a data structure that associates different attachment states with different operating states. The lookup may return the corresponding operating states.

The operating state may be used to identify how to operate the at least one indicator. For example, while the attachment state is unattached, the at least one indicator may be set in an operating state that projects a field of green light to indicate that detachment of the chassis is ok. However, while the attachment state is attached, the at least one indicator may be set in an operating state that projects a field of red light to indicate that detachment of the chassis is not ok and may result in damage to a line.

The method may end following operation 302.

Using the method shown in FIG. 3, a technician or other person may be better informed and make better decisions regarding detachment of a chassis from a rail or other structure by application. Consequently, the likelihood of lines being damaged may be reduced.

Figure 4:
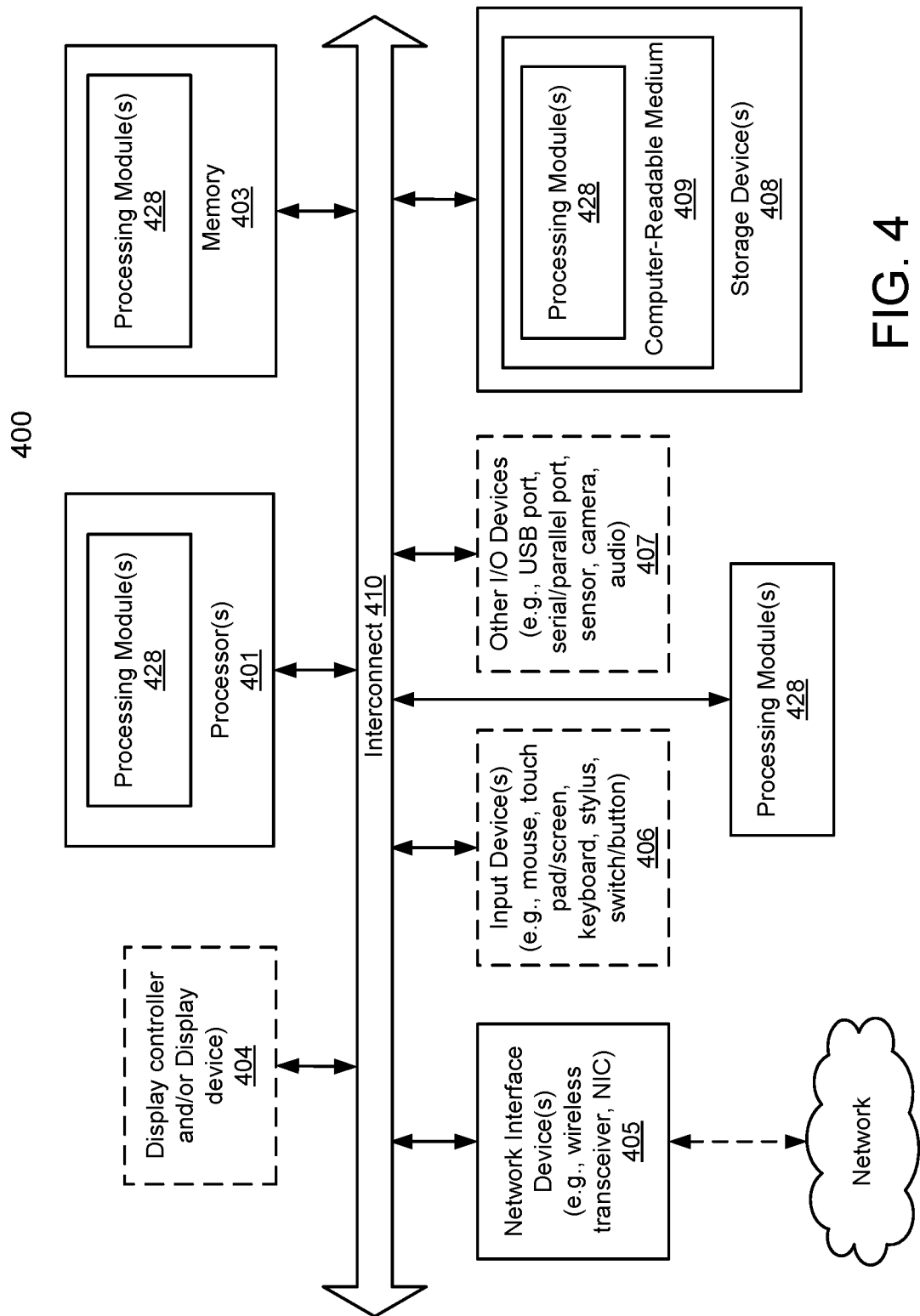
FIG. 4 shows a block diagram illustrating a data processing system in accordance with an embodiment.

Any of the components illustrated in FIGS. 1-2J may be implemented with one or more computing devices. Turning to FIG. 4, a block diagram illustrating an example of a data processing system (e.g., a computing device) in accordance with an embodiment is shown. For example, system 400 may represent any of data processing systems described above performing any of the processes or methods described above, and may include the illustrated components as well as any of the other components discussed with respect to FIGS. 1-3. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high-level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a coprocessor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random-access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a Wi-Fi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs, or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A data processing system, comprising:
   a chassis to house hardware components, the hardware components comprising a cooling system;
   an ear of the chassis, the ear of the chassis comprising:
      a reserved area, and
      a latch area;
   a latch assembly positioned with the latch area and fixedly attached to the chassis, comprising:
      a latch comprising:
         a first portion mechanically coupled to translate between a first position and a second position with respect to a second portion of the latch;
         the second portion of the latch, the second portion comprising an indicator that is adapted to indicate an attachment state of the cooling system to an external component outside of the chassis via one or more structural elements, the attachment state indicating whether the cooling system is physically connected to or physically detached from the external component via the one or more structural elements;
         a pivot mechanically coupled to the second portion, the pivot being adapted facilitate rotation of the first portion and the second portion between the second position and a third position; and
         an interference portion adapted to:
            prevent the latch from rotating while the first portion is in the first position; and
            allow the latch to rotate while the first portion is in the second position.

2. The data processing system of claim 1, further comprising:
   an attachment member adapted to:
      secure the latch assembly to a structural member of an electronic rack for housing the chassis while the first portion is in the first position; and
      release the latch assembly from the structural member while the first portion is in the third position.

3. The data processing system of claim 2, wherein while the attachment member is secured to the latch assembly, the chassis is secured in a first position in the electronic rack.

4. The data processing system of claim 3, wherein while the attachment member is released from the latch assembly, the chassis is free to move from the first position in the electronic rack to a second position with respect to the electronic rack.

5. The data processing system of claim 1, wherein the indicator generates a first color of light while the cooling system is physically connected to the external component outside of the chassis, and generates a second color of light while the cooling system is physically detached from the external component.

6. The data processing system of claim 1, wherein the indicator is positioned to be visible while the first portion is in the first position and obscured from view while the first portion is in the second position.

7. The data processing system of claim 1, wherein the first portion comprises a first end positioned to generate an interference with a wall of the ear while the first portion is in the first position, and release the interference with the wall while the first portion is in the second position.

8. The data processing system of claim 1, wherein the first portion comprises a force receiving area to receive a first force that moves the first portion from the first position to the second position.

9. The data processing system of claim 8, wherein application of a second force to the force receiving area while the first portion is in the second position initiates rotation of the first portion to the third position.

10. The data processing system of claim 9, wherein the rotation of the first portion exposes another force receiving area of the latch, and application of a third force to the other force receiving area of the latch completes the rotation of the first portion to the third position.

11. A chassis, comprising:
an ear, comprising:
a reserved area, and
a latch area; and
a latch assembly positioned with the latch area and fixedly attached to the chassis, the chassis being configured to house hardware components that comprise a cooling system, and the latch assembly comprises:
a latch comprising:
a first portion mechanically coupled to translate between a first position and a second position with respect to a second portion of the latch;
the second portion of the latch, the second portion comprising an indicator that is adapted to indicate an attachment state of the cooling system to an external component outside of the chassis via one or more structural elements, the attachment state indicating whether the cooling system is physically connected to or physically detached from the external component via the one or more structural elements;
a pivot mechanically coupled to the second portion, the pivot being adapted facilitate rotation of the first portion and the second portion between the second position and a third position; and
an interference portion adapted to:
prevent the latch from rotating while the first portion is in the first position; and
allow the latch to rotate while the first portion is in the second position.

12. The chassis of claim 11, further comprising:
an attachment member adapted to:
secure the latch assembly to a structural member of an electronic rack for housing the chassis while the first portion is in the first position; and
release the latch assembly from the structural member while the first portion is in the third position.

13. The chassis of claim 12, wherein while the attachment member is secured to the latch assembly, the chassis is secured in a first position in the electronic rack.

14. The chassis of claim 13, wherein while the attachment member is released from the latch assembly, the chassis is free to move from the first position in the electronic rack to a second position with respect to the electronic rack.

15. The chassis of claim 11, wherein the indicator generates a first color of light while the cooling system is physically connected to the external component outside of the chassis, and generates a second color of light while the cooling system is physically detached from the external component.

16. A latch assembly, comprising:
a latch, wherein the latch assembly is fixedly attached to a chassis of a data processing system, the chassis being configured to house hardware components that comprise a cooling system, the chassis further comprising an ear that comprises a reserved area and a latch area, the latch assembly being fixedly attached to the chassis within the latch area,
and the latch comprises:
a first portion mechanically coupled to translate between a first position and a second position with respect to a second portion of the latch;
the second portion of the latch, the second portion comprising an indicator that is adapted to indicate an attachment state of the cooling system to an external component outside of the chassis via one or more structural elements, the attachment state indicating whether the cooling system is physically connected to or physically detached from the external component via the one or more structural elements;
a pivot mechanically coupled to the second portion, the pivot being adapted facilitate rotation of the first portion and the second portion between the second position and a third position; and
an interference portion adapted to:
prevent the latch from rotating while the first portion is in the first position; and
allow the latch to rotate while the first portion is in the second position.

17. The latch assembly of claim 16, wherein the indicator generates a first color of light while the cooling system is physically connected to the external component outside of the chassis, and generates a second color of light while the cooling system is physically detached from the external component.

18. The latch assembly of claim 16, wherein the indicator is positioned to be visible while the first portion is in the first position and obscured from view while the first portion is in the second position.

19. The latch assembly of claim 16, wherein the first portion comprises a first end positioned to generate an interference with a wall of the ear while the first portion is in the first position, and release the interference with the wall while the first portion is in the second position.

20. The latch assembly of claim 16, wherein the first portion comprises a force receiving area to receive a first force that moves the first portion from the first position to the second position.

* * * * *